United States Patent
Park

(10) Patent No.: US 7,605,044 B2
(45) Date of Patent: Oct. 20, 2009

(54) METHOD OF MANUFACTURING SEMICONDUCTOR DEVICE

(75) Inventor: Jin-Ha Park, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 11/852,023

(22) Filed: Sep. 7, 2007

(65) Prior Publication Data

US 2008/0073715 A1    Mar. 27, 2008

(30) Foreign Application Priority Data

Sep. 22, 2006    (KR) ................ 10-2006-0092096

(51) Int. Cl.
*H01L 21/336* (2006.01)

(52) U.S. Cl. ............... 438/303; 257/314; 257/315; 257/E21.17; 257/E21.626; 257/E21.64; 438/184; 438/230; 438/265

(58) Field of Classification Search ............ 257/314, 257/315, 717, 900, E21.17, E21.626, E21.64; 438/184, 230, 265, 142, 197, 299, 301, 303, 438/595, 696

See application file for complete search history.

(56) References Cited

U.S. PATENT DOCUMENTS

| | | | | |
|---|---|---|---|---|
| 7,371,629 B2 * | 5/2008 | Fu et al. | ............ | 438/199 |
| 7,423,330 B2 * | 9/2008 | Satoh | ............ | 257/649 |
| 2002/0127763 A1 * | 9/2002 | Arafa et al. | ............ | 438/76 |
| 2004/0072435 A1 * | 4/2004 | Quek | ............ | 438/691 |
| 2008/0096331 A1 * | 4/2008 | Chen et al. | ............ | 438/151 |

* cited by examiner

*Primary Examiner*—W. David Coleman
*Assistant Examiner*—Su C Kim
(74) *Attorney, Agent, or Firm*—Sherr & Vaughn, PLLC

(57) ABSTRACT

A method of manufacturing a semiconductor device including at least one step of: forming a transistor on and/or over a semiconductor substrate; forming silicide on and/or over a gate electrode and a source/drain region of the transistor; removing an uppermost oxide film from a spacer of the transistor; and forming a contact stop layer on and/or over the entire surface of the substrate including the gate electrode.

11 Claims, 3 Drawing Sheets

METHOD OF MANUFACTURING SEMICONDUCTOR DEVICE

The present application claims priority under 35 U.S.C. 119 to Korean Patent Application No. 10-2006-0092096 (filed on Sep. 22, 2006), which is hereby incorporated by reference in its entirety.

BACKGROUND

Aspects of semiconductor technology have focused on enhancing the integration of semiconductor devices (e.g., achieving smaller scale devices). Reducing channel lengths may serve an important role in the development of smaller scale semiconductor devices. Reducing channel lengths may produce undesirable consequences such as a short channel effect.

In order to overcome or otherwise suppress the short channel effect, horizontal reduction and vertical reduction may be employed. Particularly, horizontal reduction in a gate electrode width and vertical reduction in the gate insulating thickness and source/drain junction depth. With horizontal reduction and vertical reduction, an applied voltage is reduced and a doping density of a semiconductor substrate is increased. Particularly, a doping profile of a channel region can be efficiently controlled.

Although reduction in the size of a semiconductor device can be reduced, the necessary power required for operating an electronic device is high. For example, electrons injected from a source in an NMOS transistor may be significantly accelerated in a potential gradient state of a drain, thereby the NMOS transistor may become vulnerable to hot carrier generation. Consequently, a lightly doped drain (LDD) structure may be employed in order to overcome the hot carrier generation.

Figure 1:
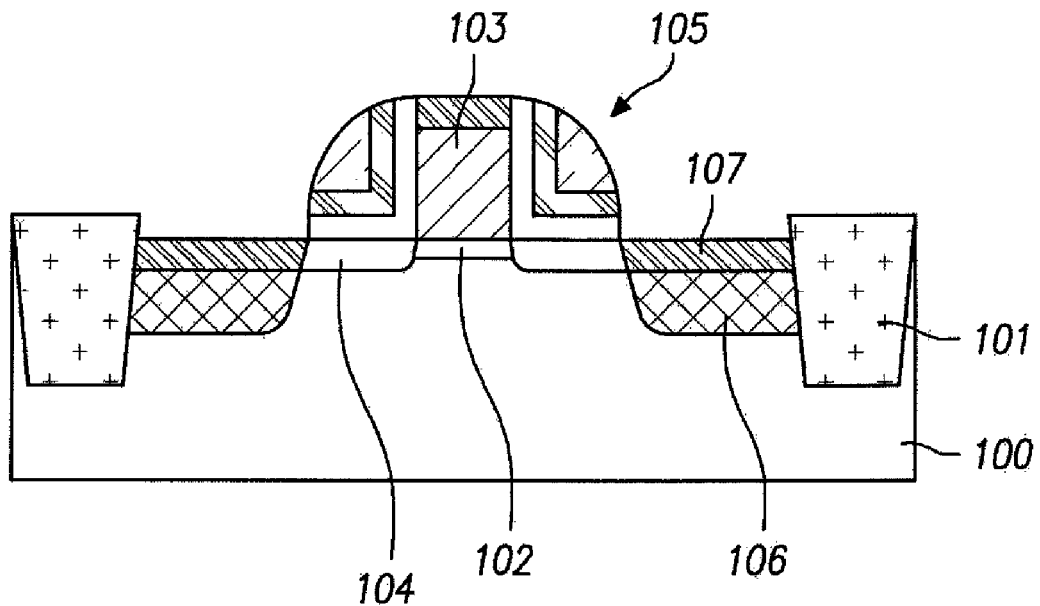

As illustrated in example FIG. 1, in a transistor having a LDD structure, low-concentration n-type region 104 may be located between channel 102 and high-concentration $n^+$-type source/drain 106. Low-concentration n-type region 104 drops a high drain voltage near a drain junction to prevent a rapid potential gradient, thereby suppressing hot carrier generation.

In order to achieve high integration in semiconductor devices, a variety of technologies for manufacturing a MOSFET having a LDD structure has been suggested. An LDD manufacturing method for forming spacer 105 on sidewalls of gate electrode 103 is one such method. While this method males it possible to obtain a reduction in channel length, its shortcomings is that it produces a reduction in charge mobility. Such reduction in charge mobility causes a reduction in drive current, which in turn, adversely effects the operability of a semiconductor device.

SUMMARY

Embodiments relate to a method of manufacturing a semiconductor device capable of increasing stress applied to a channel of a transistor to enhance charge mobility.

In accordance with embodiments, a method of manufacturing a semiconductor device includes at least one of the following steps. Forming a transistor on and/or over a semiconductor substrate. Forming silicide on and/or over a gate electrode and a source/drain region of the transistor. Removing an uppermost oxide film from a spacer of the transistor. Forming a contact stop layer on and/or over the entire surface of the substrate including the gate electrode.

In accordance with embodiments, formation of the transistor may include at least one of the following steps. Forming a gate insulating film on and/or over the semiconductor substrate. Forming a gate electrode on and/or over the gate insulating film. Forming a lightly doped drain (LDD) region on and/or over the surface of an active region at both sides of the gate electrode. Forming a spacer having an oxide-nitride-oxide (ONO) structure on both sidewalls of the gate electrode. Forming the source/drain region on and/or over the surfaces of the substrate at both sides of the gate electrode including the spacer.

In accordance with embodiments, formation of the spacer may include at least one of the following steps. Sequentially laminating an oxide film, a nitride film and an oxide film on and/or over the entire surface of the substrate including the gate electrode. Performing a reactive ion etching process such that an ONO structure remains on both sidewalls of the gate electrode.

In accordance with embodiments, the ONO structure may include sequentially laminating from a lower surface of the substrate an oxide film having a thickness range of approximately 150 to 200 angstroms, a nitride film having a thickness range of approximately 150 to 200 angstroms and an oxide film having a thickness range of approximately 300 to 500 angstroms.

Preferably, the uppermost oxide film may be removed using a wet etching process, and the wet etching process may be performed using any one of a mixed solution of $NH_4F$ and HF and a buffered HF (BHF) solution for 30 to 60 seconds. The mixed solution of $NH_4F$ and HF may have a ratio of 30:6.

Preferably, the contact stop layer may be formed using a plasma enhanced chemical vapor deposition (PECVD) method. Here, the PECVD method may be performed at a temperature of 300 to 500° C. for 30 to 60 seconds under the condition that bias power is set to 10 to 20 W and a ratio of $SiH_4$ to $NH_3$ is set to 3:1 to 5:1. In more detail, when an NMOS transistor is formed on the semiconductor substrate, bias power for the PECVD method may be set to 10 to 12 W and a ratio of $SiH_4$ to $NH_3$ may be set to 5:1 such that the contact stop layer has a tensile stress characteristic. Alternatively, when a PMOS transistor is formed on the semiconductor substrate, bias power for the PECVD method may be set to 18 to 20 W and a ratio of $SiH_4$ to $NH_3$ may be set to 3:1 such that the contact stop layer has a compressive stress characteristic.

Preferably, the contact stop layer may be formed with a thickness of 300 to 500 angstroms.

Preferably, the contact stop layer may be formed of a nitride film.

DRAWINGS

Example FIG. 1 illustrates a method of manufacturing a semiconductor device.

Example FIGS. 2A to 2E illustrate a method of manufacturing a semiconductor device, in accordance with embodiments.

DESCRIPTION

Figure 2A:
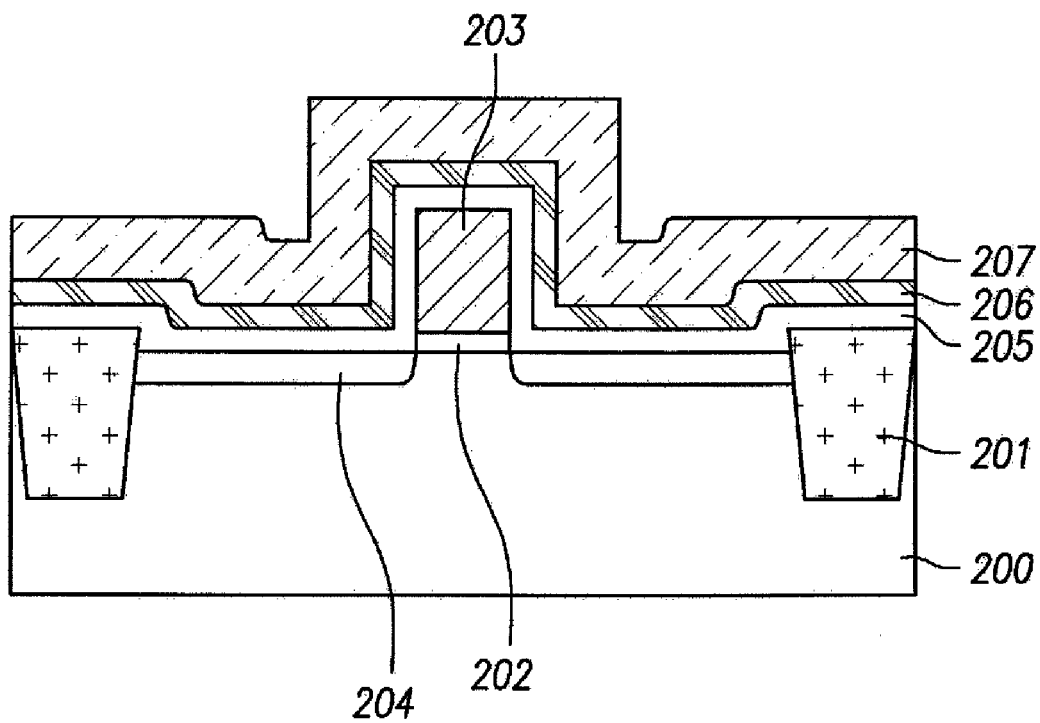

As illustrated in example FIG. 2A, device isolation film 201 is formed in a field region of semiconductor substrate 200 to define an active region in semiconductor substrate 200. Device isolation film 201 may be formed using an isolation process such as shallow trench isolation (STI). Semiconductor substrate 200 may be a conductive n-type or a p-type single crystal silicon substrate.

Figure 2B:
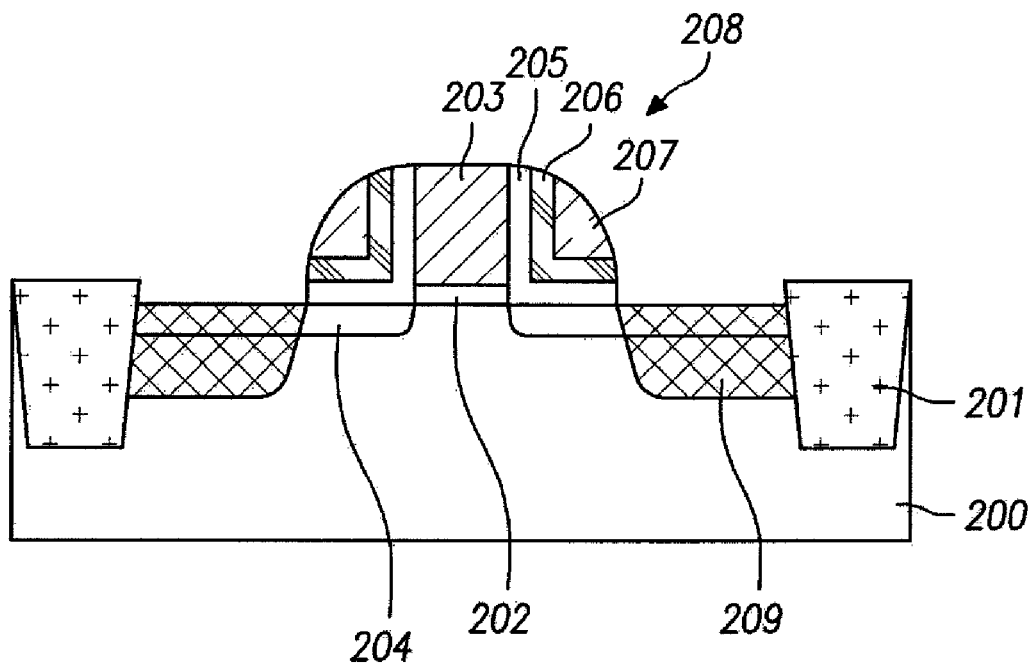

As illustrated in example FIG. 2B, after formation of device isolation film 201, a transistor is formed that may include gate insulating film 202, gate electrode 203, lightly doped drain (LDD) region 204, spacer 208 including first oxide film 205, nitride film 206 and second oxide film 207, and source/drain region 209.

Gate insulating film 202 can be deposited on and/or over the active region of semiconductor substrate 200 using a thermal oxidation process. A conductive layer for gate electrode 203 is laminated on gate insulating film 202. A photoresist pattern for an etching mask corresponding to a pattern of gate electrode 203 can be formed on and/or over the conductive layer in a region where gate electrode 203 will be formed. The photoresist pattern can be formed using a photolithographic process. Thereafter, the conductive layer and gate insulating film 202 can be etched until the active region of semiconductor substrate 200 is exposed, while leaving the conductive layer and gate insulating film 202. Accordingly, the patterns of gate electrode 203 and gate insulating film 202 can be formed on and/or over a portion of the active region.

Subsequently, LDD region 204 can be formed using a low-concentration dopant ion implantation process with respect to the entire surface of substrate 200. If the dopant ions are an n-type, arsenic (As) ions may be used under the condition that energy is in a range between approximately 1 to 3 KeV and a dosage in a range between approximately is 5E14 to 5E15 ions/cm$^2$. If the dopant ions are a p-type, $BF_2$ ions can be used under the condition that energy is in a range between approximately 1 to 3 KeV and a dosage in a range between approximately 1E14 to E15 ions/cm$^2$. The dopant ions can be implanted into the exposed active region of semiconductor substrate 200 to form a low-concentration dopant ion implantation region. The low-concentration dopant ion implantation region becomes LDD region 204 through a subsequent annealing process. Meaning, LDD region 204 can be formed in the surface of the active region located at both sidewalls of gate electrode 203.

Subsequently, an insulating film can be deposited using a low-pressure chemical vapor deposition (LPCVD) method. At this time, the insulating film can be composed of a three-layer laminate film having an oxide-nitride-oxide (ONO) structure including first oxide film 205, nitride film 206 and second oxide film 207. The thickness of first oxide film 205 can be in a range between approximately 150 to 200 Angstrom. The thickness of the nitride film 206 can be in a range between approximately 150 to 200 Angstrom. The thickness of second oxide film 207 can be in a range between approximately 300 to 500 Angstrom. First oxide film 205 and second oxide film 207 can be composed of tetra ethyl ortho silicate (TEOS).

As illustrated in example FIG. 2B, once the ONO insulating film is formed, it can be etched using a dry etching process having an anisotropic etching characteristic, such as a reactive ion etching (RIE) process. The etching results in the formation of spacer 208 having an ONO insulating film configuration that remains on sidewalls of gate electrode 203.

Source/drain region 209 may be formed in the surfaces of substrate 200 at both sides of gate electrode 203 including spacer 208 using a high-concentration dopant ion implantation process. Particularly, if n-type dopant ions are used, phosphorous P+ ions can be implanted into the entire surface of substrate 200 at an energy range between approximately 4 to 6 KeV and 4E14 to 5E15 ions/cm$^2$. If p-type dopant ions are used, boron B+ ions can be implanted into the entire surface of substrate 200 at an energy range between approximately 2 to 4 KeV and 1E15 to 5E15 ions/cm$^2$. Under the above-described condition, the source/drain region 209 is formed.

After formation of the transistor, a silicide layer can be formed on and/or over the entire surface of substrate 200 including source/drain region 209 and gate electrode 203 of the transistor. In order to form the silicide layer, a Co layer, a Ti layer and a TiN layer can be sequentially laminated on and/or over substrate 200. The Co layer may be formed having a thickness range of between approximately 120 to 150 Angstrom. The Ti layer may be formed with having a thickness range of between approximately 190 to 210 Angstrom. The TiN layer may be formed having a thickness range of between approximately 210 to 230 Angstrom. The Ti layer can be used as a protective film against oxygen during a reaction between Co and Si. The Ti layer may also control the reaction between Co and Si. The processes of forming the Ti layer and the TiN layer may be continuously performed in the same deposition chamber or may be separately performed in different deposition chambers.

After formation of the silicide layer, a first rapid thermal process (RTP) can be performed with respect to the resultant material. A CoSi layer can be selectively formed on and/or over the surface of source/drain region 209 and gate electrode 203. The first RTP may be performed at a temperature range between approximately 450 to 500° C. for 50 to 60 seconds. Subsequently, after the first RTP is completed, the non reacted Co layer, Ti layer and TiN layer are sequentially removed. At this time, the non reacted Co layer and the Ti layer can be removed using a predetermined wet etching process.

Figure 2C:
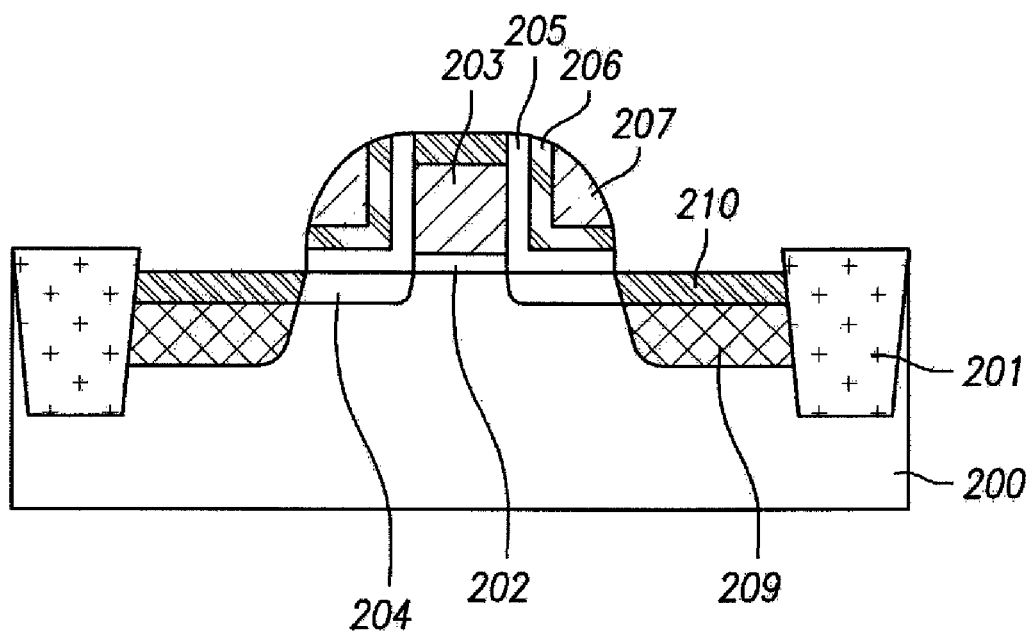

As illustrated in example FIG. 2C, a second RTP can then be performed with the resultant material. Cobalt silicide layer 210 can be selectively formed on and/or over the surface of source/drain region 209 and gate electrode 203. At this time, the second RTP may be performed at a temperature range between approximately of 800 to 850° C. for 10 to 40 seconds.

Figure 2D:
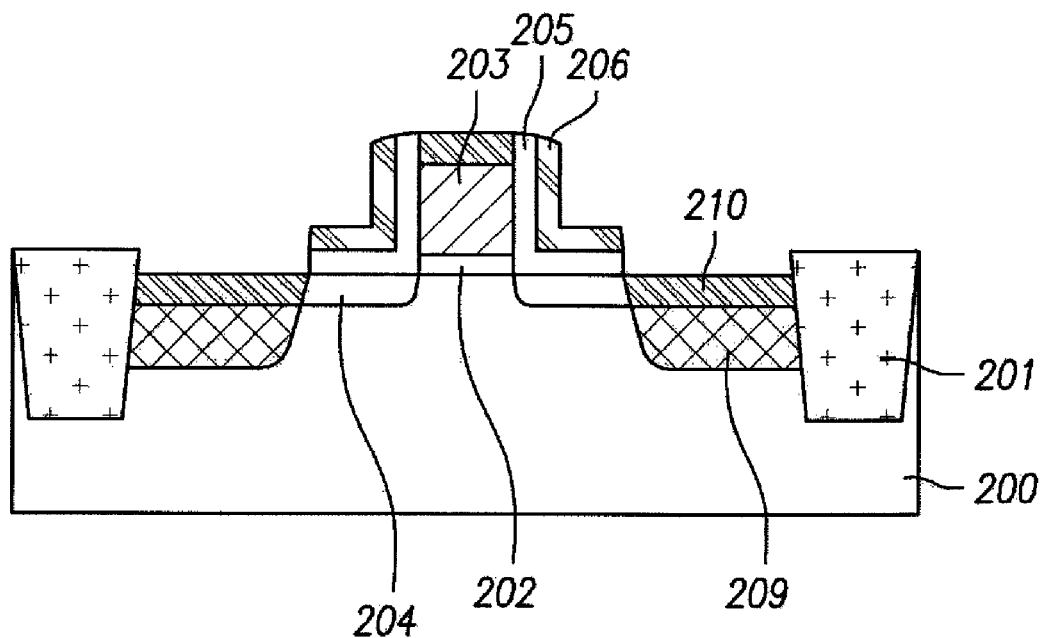

As illustrated in example FIG. 2D, a process of removing uppermost second oxide film 207 from spacer 208 having the ONO structure can be performed. At this time, a wet etching process can be performed using any one of a mixed solution of $NH_4F$ and HF and a buffered HF solution for 30 to 60 seconds such that second oxide film 207 can be removed.

When the process of removing second oxide film of the ONO structure is performed, contact stop layer 211 can be formed closer to a channel region located at the lower side of substrate 200. Accordingly, larger stresses may be induced to the channel region.

Figure 2E:
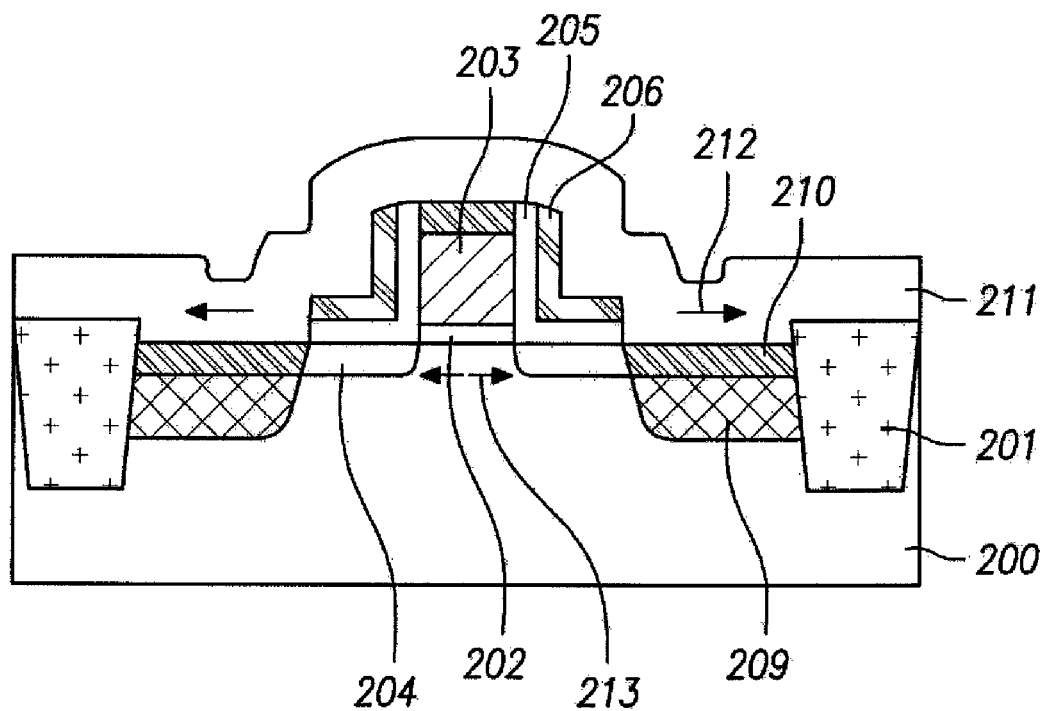

As illustrated in example FIG. 2E, contact stop layer 211 can be formed on and/or over the entire surface of substrate 200 including gate electrode 203 using a nitride film (SiN). Contact stop layer 211 can be formed using a plasma enhanced chemical vapor deposition (PECVD) method. Contact stop layer 211 may be formed having a thickness range of approximately of 300 to 500 Angstrom. The PECVD method can be performed at a temperature range of between approximately of 300 to 500° C. for 30 to 60 seconds. The PECVD method for depositing contact stop layer 211 can be performed using a bias power in a range between approximately 10 to 20 W and whereby a ratio of $SiH_4$ to $NH_3$ is set to 3:1 to 5:1.

At this time, as the bias power is in a range between approximately 10 to 12 W, SiN may exhibit larger tensile stress. As the percentage of $SiH_4$ becomes larger than that of the $NH_3$, i.e., when the ratio of $SiH_4$ to $NH_3$ is 5:1, larger tensile stresses can be obtained. In order to obtain larger tensile stresses, the transistor can be an NMOS transistor.

As the bias power increases to 18 to 20 W, SiN exhibits greater compressive stresses. As the percentage of $SiH_4$ becomes smaller than that of the $NH_3$, i.e., when the ratio of SiH$_4$ to NH$_3$ is 3:1, greater compressive stresses can be obtained. In order to obtain the larger compressive stresses, the transistor can be a PMOS transistor.

In accordance with embodiments, the MOSFET transistor can be an NMOS transistor. After the formation of the transistor is completed, contact stop layer 211 having a large tensile stress characteristic can be formed on and/or over the entire surface of substrate 200 including gate electrode 203. Contact stop layer 211 can be deposited under the condition that the bias power decreases and the percentage of SiH$_4$ increases such that contact stop layer 211 exhibits high tensile stresses. In the process of forming contact stop layer 211, the lattice distance of the channel region may increase by also applying tensile stresses 212 to the channel region of silicon substrate 200. When the lattice distance of the channel region of the NMOS increases, electron scattering due to the lattice can be reduced and electron mobility can be enhanced.

If the transistor is a PMOS, contact stop layer 211 can be formed on and/or over the entire surface of substrate 200 including gate electrode 203 after formation of the transistor. Contact stop layer 211 can be deposited under the condition that bias power increases and the percentage of SiH$_4$ decreases such that contact stop layer 211 has the required compressive stress characteristic. In the process of forming the contact stop layer 211, the lattice distance of the channel region may decrease by also applying compressive stresses to the channel region of silicon substrate 200. When the lattice distance of the channel region of the PMOS decreases, electron mobility can be enhanced.

In accordance with embodiments, second oxide film 207 can be removed from spacer 208 having the ONO structure such that contact stop layer 211 can be formed closer to the channel region. Accordingly, larger stresses can be induced to the channel region, and thus, electron mobility and the drive current Idr of the transistor may increase.

In accordance with embodiments, since electron mobility can be increased by increasing applied stresses to a channel region of a transistor, it may be possible to enhance the operability and electrical characteristics of a semiconductor device.

In accordance with embodiments, stress may be applied to a channel region located at the lower side of a substrate by laminating a contact stop layer having a high tensile stress characteristic on and/or over the entire surface of a substrate including a gate electrode after formation of a transistor. This configuration can enhance electron mobility in the channel region of the substrate. Consequently, the drive current of the transistor can increase in addition to the operability and electrical characteristics of a semiconductor device.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
   forming a transistor over a semiconductor substrate, the transistor including a gate electrode, a source/drain region and a spacer having a laminated structure on sidewalls of the gate electrode including a first oxide film, a nitride film and a second oxide film;
   forming silicide over the gate electrode and the source/drain region;
   removing the second oxide film of the spacer; and
   forming a contact stop layer over the entire surface of the substrate including the gate electrode, wherein the contact stop layer is formed using a plasma enhanced chemical vapor deposition (PECVD) method, wherein the PECVD method is performed at a temperature range of between approximately 300 to 500° C. for 30 to 60 seconds with a bias power in a range between approximately 10 to 20 W and a ratio of SiH$_4$ to NH$_3$ in a range between 3:1 to 5:1, wherein the contact stop layer has at least one of tensile stress characteristics and compressive characteristics.

2. The method of claim 1, wherein forming the transistor comprises at least one of:
   forming a gate insulating film over the semiconductor substrate;
   forming the gate electrode over the gate insulating film;
   forming a lightly doped drain (LDD) region over the surface of an active region at the sidewalls of the gate electrode;
   forming the spacer; and
   forming the source/drain region over the surface of the substrate at the sidewalls of the gate electrode including the spacer.

3. The method of claim 1, wherein forming the spacer comprises at least one of:
   sequentially laminating over a lower side of the susbtrate a ONO structure including the first oxide film, the nitride film and the second oxide film over the entire surface of the substrate including the gate electrode; and
   performing a reactive ion etching process such that the ONO structure remains on the sidewalls of the gate electrode.

4. The method of claim 3, wherein the first oxide film has a thickness in a range between approximately 150 to 200 Angstroms, the nitride film has a thickness in a range between approximately 150 to 200 Angstroms and the second oxide film has a thickness in a range between approximately 300 to 500 Angstroms.

5. The method of claim 1, wherein the second oxide film is removed using a wet etching process.

6. The method of claim 5, wherein the wet etching process uses at least one of a mixed solution of NH$_4$F and HF and a buffered HF (BHF) solution for 30 to 60 seconds.

7. The method of claim 6, wherein the mixed solution of NH$_4$F and HF has a ratio of 30:6.

8. The method of claim 1, wherein the contact stop layer is formed having a thickness range of between approximately 300 to 500 Angstroms.

9. The method of claim 1, wherein the contact stop layer comprises a nitride film.

10. A method comprising:
    forming a transistor over a semiconductor substrate, the transistor including a gate electrode, a source/drain region and a spacer having a laminated structure on sidewalls of the gate electrode including a first oxide film, a nitride film and a second oxide film;
    forming silicide over the gate electrode and the source/drain region;
    removing the second oxide film of the spacer; and
    forming a contact stop layer over the entire surface of the substrate including the gate electrode, wherein the contact stop layer is formed using a plasma enhanced chemical vapor deposition (PECVD) method, wherein the contact stop layer has at least one of tensile stress characteristics and compressive characteristics, wherein:

the transistor is an NMOS transistor; and the contact stop layer is formed by the PECVD method using a bias power in a range between approximately 10 to 12 W and a ratio of $SiH_4$ to $NH_3$ of 5:1 such that the contact stop layer has the tensile stress characteristic.

11. A method comprising:

forming a transistor over a semiconductor substrate, the transistor including a gate electrode, a source/drain region and a spacer having a laminated structure on sidewalls of the gate electrode including a first oxide film, a nitride film and a second oxide film;

forming silicide over the gate electrode and the source/drain region;

removing the second oxide film of the spacer; and forming a contact stop layer over the entire surface of the substrate including the gate electrode, wherein the contact stop layer is formed using a plasma enhanced chemical vapor deposition (PECVD) method, wherein the contact stop layer has at least one of tensile stress characteristics and compressive characteristics, wherein, the transistor is a PMOS transistor; and the contact stop layer is formed by PECVD using a bias power in a range between approximately 18 to 20 W and a ratio of $SiH_4$ to $NH_3$ of 3:1 such that the contact stop layer has the compressive stress characteristic.

* * * * *